United States Patent [19]
Ochoa et al.

[11] Patent Number: 6,054,682
[45] Date of Patent: Apr. 25, 2000

[54] METHOD AND SYSTEM FOR REDUCING WATER VAPOR IN INTEGRATED CIRCUIT PACKAGES PRIOR TO REFLOW

[75] Inventors: Roland Ochoa, Nampa; Derek T. Smith, Eagle, both of Id.

[73] Assignee: Micron Electronics, Inc., Boise, Id.

[21] Appl. No.: 09/266,499

[22] Filed: Mar. 11, 1999

[51] Int. Cl.⁷ ............................. F26B 13/10; F27B 3/19; F27B 9/14
[52] U.S. Cl. .................. 219/388; 221/71; 221/150 A; 222/146.5; 34/625
[58] Field of Search ................................... 219/385, 388, 219/392, 393; 222/146.2, 146.5; 414/209, 216, 147, 150, 153; 221/71, 74, 150 A; 34/442–444, 267, 273, 629, 625, 627

[56] References Cited

U.S. PATENT DOCUMENTS

| | | | |
|---|---|---|---|
| 3,815,251 | 6/1974 | Gelder | 34/289 |
| 4,705,311 | 11/1987 | Ragard . | |
| 4,769,904 | 9/1988 | Porterfield et al. . | |
| 4,860,438 | 8/1989 | Chen . | |
| 4,951,400 | 8/1990 | Elliott et al. | 34/442 |
| 5,323,528 | 6/1994 | Baker . | |
| 5,446,960 | 9/1995 | Isaacs et al. . | |
| 5,449,265 | 9/1995 | Legrady et al. . | |
| 5,524,765 | 6/1996 | Gutentag . | |
| 5,605,430 | 2/1997 | Legrady . | |
| 5,613,632 | 3/1997 | Kohn . | |
| 5,732,478 | 3/1998 | Chapman et al. | 34/629 |
| 5,778,524 | 7/1998 | Stridsberg . | |

*Primary Examiner*—Joseph Pelham
*Attorney, Agent, or Firm*—Knobbe, Martens, Olson & Bear, LLP

[57] ABSTRACT

A system and method for assembling components onto a circuit board is disclosed. The system includes: a thermal chamber for receiving a plurality of components therein and for heating the plurality of components at a predetermined temperature for a predetermined length of time; an outfeed slot located on a wall of the thermal chamber which allows at least one component from the plurality of components to pass therethrough and emerge externally of the thermal chamber; and a pick and place machine, located adjacent to the thermal chamber, which automatically retrieves the at least one component which has passed through the outfeed slot and automatically places the at least one component onto a designated circuit board. The method includes: placing at least one component into an interior chamber of a thermal oven; heating the at least one component at a predetermined temperature within the thermal oven for a predetermined length of time; passing the at least one component through an outfeed slot located on a wall of the thermal oven, at the expiration of the predetermined length of time, such that the at least one component emerges externally of the thermal oven; and retrieving the at least one component which emerges from the thermal oven through the outfeed slot with an automated pick and place machine which thereafter places the at least one component onto a designated circuit board.

44 Claims, 5 Drawing Sheets

METHOD AND SYSTEM FOR REDUCING WATER VAPOR IN INTEGRATED CIRCUIT PACKAGES PRIOR TO REFLOW

BACKGROUND OF THE INVENTION

1. Field of the Invention

The invention relates to removing water vapor trapped in integrated circuit (IC) packages, and more particularly, to a method and system which removes trapped water vapor in IC packages immediately prior to reflow soldering of the IC onto a circuit board as part of the in-line assembly process.

2. Description of the Related Technology

In the surface mount board manufacturing industry, high speed automated placement machines are used to place surface mount components onto bare printed circuit boards (PCBs) prior to their fixation to the board using methods such as the well known reflow soldering process. To accomplish this placement, parts are first received from a manufacturer in one of several mediums, including 1) loose parts in a tube; 2) parts in a tape and reel; and 3) parts trays. These parts are extracted from their packaging mediums and then loaded into a placement machine which automatically places them onto the PCB. One of the most popular packaging mediums is the parts tape and reel because it provides maximum efficiency in retrieving components from the tape and reel and thereafter placing them onto designated PCBs.

FIG. 1 illustrates a typical parts tape 101 in which IC components may be received prior to their assembly on the PCB. As shown in FIG. 1, the parts tape 101 is of sufficient thickness that it includes cavities 103 therein for storing an integrated circuit (IC) component (not shown). These components are sealed or encapsulated within the cavities 103 by means of a covering film 105, typically made of a plastic or other cellophane-type material. The parts tape 101 is typically wrapped around a reel (not shown).

FIG. 2 shows the parts tape 101 of FIG. 1 being fed through a feeder 107. As the parts tape 101 moves through the feeder 107, a component (not shown) within a cavity 103 of the parts tape 101 reaches a pickup point 109 where the component is extracted from the tape 101 either manually or automatically by a component placement ("pick and place") machine. The automatic placement machine typically includes a processor for processing input coordinates in order to accurately determine the position of components during the retrieval from a specified packaging medium, e.g., the parts tape and reel. These placement machines can also calculate the position in which these components are to be placed on a PCB. The placement machines also typically include a controller for controlling a robotic mechanism which picks up each component and then places the component onto the PCB. The automatic placement of a part onto a PCB may be accurate to within fractions of a millimeter of a specified target location. This accuracy is accomplished by a machine vision system which looks for two fiducial coordinates, which are typically actual pads positioned on the PCB. The placement machine then aligns each part or component to be placed on the PCB in relation to these fiducial coordinates. Such automatic placement machines, and their corresponding vision systems, are well-known in the art.

IC packages, as well as other types of plastic packages, absorb moisture from the atmosphere and trap the moisture within tiny pores in each package. This trapped moisture, or water vapor, remains absorbed in the package until it is heated, where upon the water vapor turns into a gas and evaporates out of the pores of the package. It has been observed that this trapped water vapor in the IC package poses a problem during the mounting of the IC onto the PCB.

Surface mount technology (SMT), otherwise known as reflow soldering, is increasingly being employed as a cost-effective means of mounting IC devices to printed circuit boards. Numerous different techniques for mounting integrated circuit devices to circuit boards, chip carriers, or other components, fall within the general category of SMT. In a typical SMT process, an IC device is placed onto and aligned with a printed circuit board (PCB) as was described above, and thereafter mounted to the PCB using reflow solder processing techniques. Reflow solder processes generally use forced convection heating (air or nitrogen) to melt solder interposed between the surfaces to be joined. The IC device and PCB assembly is then exposed to a temperature profile which results in reflow of the solder. Surface tension created in the resulting solder liquid mass during reflow tends to prevent collapse of the solder, causing the joint to eventually solidify in a barrel or truncated sphere shape that is commonly referred to as a controlled collapse chip connection or "C-4" connection. Numerous variations on this general theme exist, including the use of two or more different solders with various melting points to produce reflow of various portions of the joint during different processes, or to allow rework.

Attachment of an IC device onto a PCB is typically accomplished by using solder paste bricks which are formed by screen printing eutectic solder paste onto an array of solder pads on the PCB. A typical method of screen printing includes the step of placing a solder paste stencil, having apertures that are of the same shape as the desired solder paste bricks, onto a PCB such that the apertures are aligned with the pads of the PCB. Solder paste is then applied to the unmasked areas, and the stencil is subsequently removed. The IC device is then placed onto the PCB, typically by an automated placement machine, such that the leads of the IC device make contact with the solder paste bricks on the etched pads of the PCB. The entire assembly is then passed through a reflow process which applies a predetermined time/temperature profile to the solder paste bricks to liquefy the solder paste bricks, thereby forming solder joints between the IC device and the pads of the PCB. The temperatures required to perform this reflow process are in the range of 180–200° C.

At these higher temperatures, any moisture which is absorbed and trapped in the pores of the IC packaging, almost instantaneously transforms into a gaseous state which rapidly expands out of the pores of the IC packaging. The resultant volatile gases literally explode out of the pores of the IC package, thereby creating the "popcorn effect" which can substantially damage not only the package of the IC but the underlying components as well. This rapidly expanding volatized gas sometimes causes problems in the structural integrity of the IC component, such as delamination, cracking or possibly deformation of the package, and hence the reliability and functionality of the IC component is compromised.

Component manufacturers have attempted to remove water vapor from the IC packages by baking the components at a predetermined temperature for a predetermined length of time, e.g., 160 hours at 40° C., or 24 hours at between 90° C. and 100° C. After this baking period, the components are typically encapsulated in a parts tape and reel, parts tray, vacuum-packed bag or vapor barrier bag accompanied by a desiccant package.

Component manufacturers who follow the above process of eliminating or reducing moisture absorbed into the packaging of their manufactured components have not been completely successful. This is because there is typically a lag time between the baking process and the process of packaging the components into the respective packaging media, e.g., parts tape, parts tray or vacuum/vapor barrier bag. During this intermittent delay period, moisture from the atmosphere can settle onto the component packages and be absorbed into the micropores of the packages. Although the bake process eliminates much of the water molecules trapped in the component packages, depending on the delay between baking and sealing in their respective packaging mediums, a significant amount of moisture may once again permeate into the micropores of the packages. Thus, it has been a common experience among electronics manufacturers who buy components from component manufacturers, that many of the components shipped by the component manufacturers contain trapped moisture in their packages. As explained above, this trapped moisture may damage the IC during reflow soldering of the IC onto a circuit board by producing a "popcorn effect" as the heat involved in reflow soldering converts the water molecules into volatile gases which literally explode out of the micropores of the packaging of the IC.

Electronics manufacturers have attempted to deal with the "popcorn effect" by performing an in-house baking process themselves prior to reflow soldering of the components onto PCBs. However, as explained in further detail below, even this second in-house baking process has been unsuccessful in completely eliminating the "popcorn effect" because the electronics manufacturers typically perform their in-house baking process well in advance of the automated assembly process. This delay between the baking process and the reflow soldering process allows moisture from the atmosphere to once again settle into the pores of the component packages.

Prior parts tapes and reels have not been well suited for baking in thermal ovens for prolonged periods of time because these prior parts tapes and reels were typically made from a plastic material which tended to melt, warp, or otherwise become deformed when exposed to temperatures up to 100° C. for prolonged periods of time. As a result, electronics manufacturers have typically extracted the components from the parts tapes and placed them in a tray or other suitable medium having the required thermal characteristics to withstand baking at temperatures of up to 100° C. After the components are baked in this baking tray for approximately four hours, for example, the components are then placed back into the parts tape where they await to be assembled onto designated PCBs. This process of removing the components from the parts tape to place them onto a bake tray and, thereafter, inserting the components back into the parts tape for subsequent assembly by an automated pick and place machine, is a time-consuming and tedious process which wastes valuable resources of the company. Additionally, the amount of time required to re-insert the components from the bake tray into the parts tape allows moisture from the atmosphere to once again be absorbed into the component packages. Furthermore, any additional delay between the time the components are reinserted into the parts tape and the time when they are retrieved from the parts tape by the automated placement machine for assembly onto PCBs, allows additional moisture from the atmosphere to permeate into the component packaging. Therefore, even those electronics companies which perform a second in-house bake process, as described above, prior to assembly of the components onto circuit boards, may experience a significant amount of damage to their components as a result of the "popcorn effect" during reflow soldering of the ICs onto the PCBs.

In view of the deficiencies of prior methods and systems which attempted to eliminate or reduce the "popcorn effect" exhibited during the reflow soldering process, an improved method and system is needed which eliminates the unnecessary time, energy and human resources required to transfer components from a parts tape and reel to a bake tray and thereafter to transfer the components from the bake tray back into the parts tape for subsequent assembly by an automated pick and place machine. Furthermore, the method and system should eliminate or reduce as much as possible any delay between the time the components are baked and the time the components are reflow soldered onto designated PCBs.

SUMMARY OF THE INVENTION

The invention addresses the above and other needs by providing a method and system in which various production steps, described above, may be eliminated, thereby saving time, energy and human resources. Additionally, the method and system of the invention eliminate any unnecessary delay between the baking process which eliminates water vapor at a controlled rate, and the subsequent assembly of the components by means of reflow soldering, onto designated printed circuit boards. In this way, moisture from the atmosphere is not given a chance to saturate the packaging of the component after the baking process is completed.

In a first aspect of the invention, a system for heating or thermally conditioning components prior to placement on a circuit board or other substrate is disclosed. In one embodiment, a thermal chamber is attached to, or placed in the vicinity of, an automated pick and place machine. The thermal chamber is configured to contain a number of parts tapes and reels inside its heated chamber. The parts tapes and reels sit on a motor-driven threaded rod which advances the parts tapes and reels, one at a time, toward an outlet slot located on a door or side wall of the thermal chamber, at a calculated rate. Once the parts tapes and reels have remained in the thermal oven for a sufficient period of time at a predetermined temperature, e.g., two hours at 95° C., a leading end of a first parts tape is advanced through the outlet slot such that the parts tape emerges from the internal chamber of the thermal oven. As the parts tape is unraveled from its corresponding reel and emerges from the outlet slot of the thermal chamber, a placement head of the automated placement machine extracts components, one at a time, from the cavities of the parts tape and thereafter places the components onto designated locations on designated circuit boards, typically printed circuit boards.

In a second embodiment, the thermal oven described above is fitted with a sliding slot which can accommodate one or more tape reels while maintaining a thermal seal on the interior of the oven. The sliding slot utilizes a flexible curtain assembly which allows the slot to move laterally across the front of the oven.

In yet another embodiment, a pressurization control system is attached to the thermal oven described above to maintain a pressure other than atmospheric within at least a portion thereof. Ideally, a vacuum is maintained within the oven during heating, thereby reducing the water vapor pressure within the oven and allowing for the use of lower conditioning temperatures, or alternatively, reduced conditioning times at the same temperature. Additionally, an inert gas or other fluid may be used to purge the oven during operation, or during periods of non-use, if desired.

In another aspect of the invention, a method of assembling components onto a circuit board includes: placing at least one component into an interior chamber of a thermal oven; heating the at least one component at a predetermined temperature within the thermal oven for a predetermined length of time; passing the at least one component through an outfeed slot located on a wall of the thermal oven, at the expiration of the predetermined length of time, such that the at least one component emerges externally of the thermal oven; and retrieving the at least one component which emerges from the thermal oven through the outfeed slot with an automated pick and place machine which thereafter places the at least one component onto a designated circuit board.

In yet another aspect of the invention, a device which is thermally conditioned using the above-described apparatus and method is disclosed.

DETAILED DESCRIPTION OF THE INVENTION

The invention is now described in detail below with reference to the figures, wherein like elements are referenced with like numerals throughout.

Although the following discussion focuses on a bake/assembly process for components stored in a parts tape and reel format, it should be understood that the below-described bake and assembly process may be applied to components which are stored in any one of numerous other formats that are well-known in the art.

Figure 3:
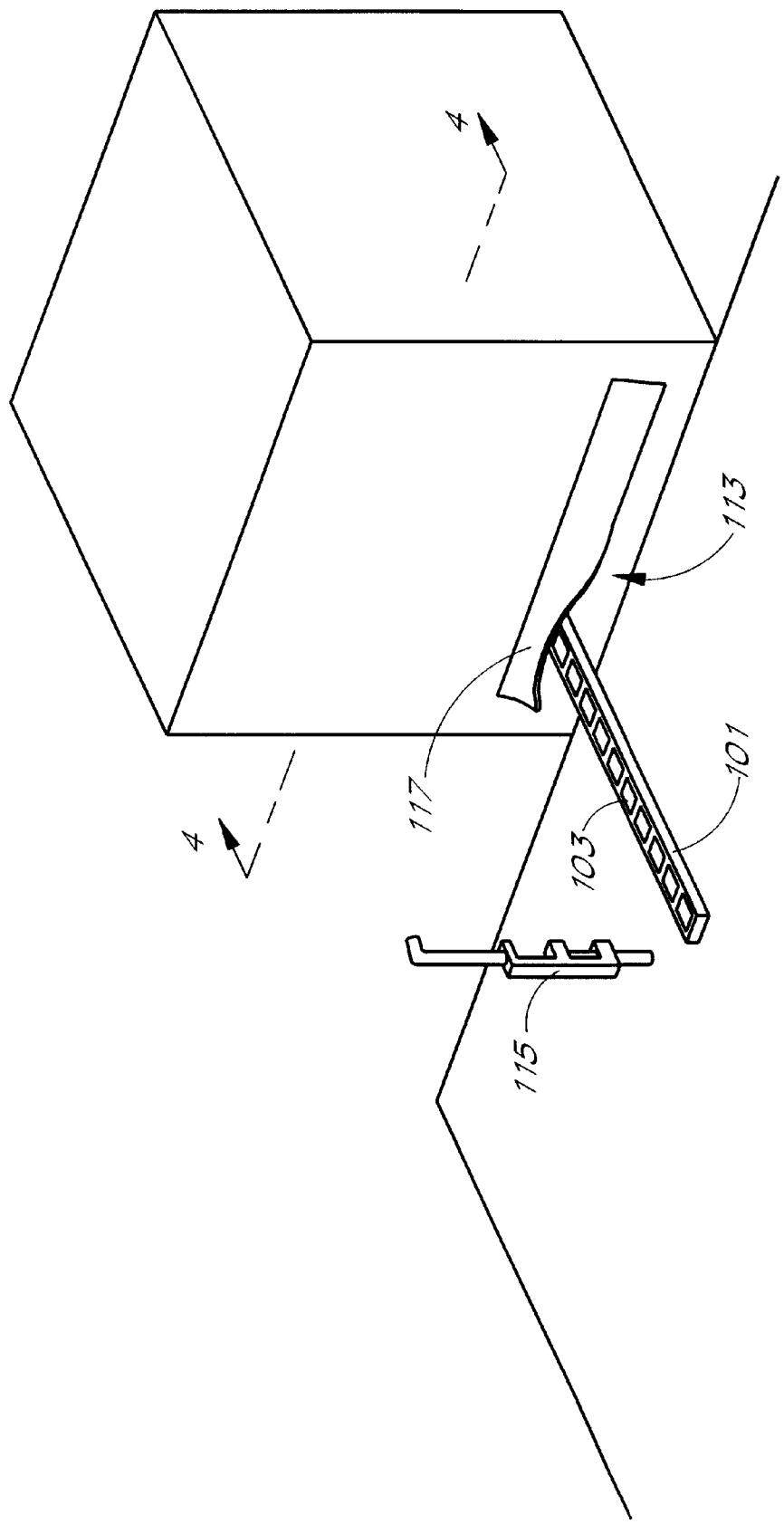
FIG. 3 illustrates a system for in-line baking of components in a parts tape and reel immediately prior to automated assembly of the components onto designated PCBs, in accordance with one embodiment of the invention.

FIG. 3 illustrates a system for in-line baking of components in a parts tape and reel immediately prior to automated assembly of the components onto designated PCBs, in accordance with one embodiment of the invention. The in-line baking system includes a thermal oven, or chamber, 111 which holds at least one parts tape 101 and reel therein. The thermal oven 111 includes an outfeed slot 113 located on one side of the thermal oven 111. As shown in FIG. 3, a leading portion of the parts tape 101 having cavities 103 for containing components therein, emerges from the slot 113 so as to be accessible by a vacuum placement nozzle 115 of an automated placement machine (not shown). As mentioned above, many parts tapes and reels of prior art systems are not well suited for baking in thermal ovens for prolonged periods of time. These prior art parts tapes and reels are typically made from a plastic material which tends to melt, warp, or otherwise become deformed when exposed to temperatures up to 100° C. for prolonged periods of time. Therefore, the parts tapes 101 and reels which may be used in accordance with the present invention should be made from a thermally resistant material capable of withstanding exposure to high temperatures of up to 100 degrees C, or more, for prolonged periods of time. In one embodiment, the reel is made of a high impact polystyrene, the carrier (parts) tape 101 made of conductive polystyrene, and the cover film 105 made of an anti-static polyester film coated with a heat activated adhesive coating, although it will be appreciated that other materials may be used.

Figure 1:
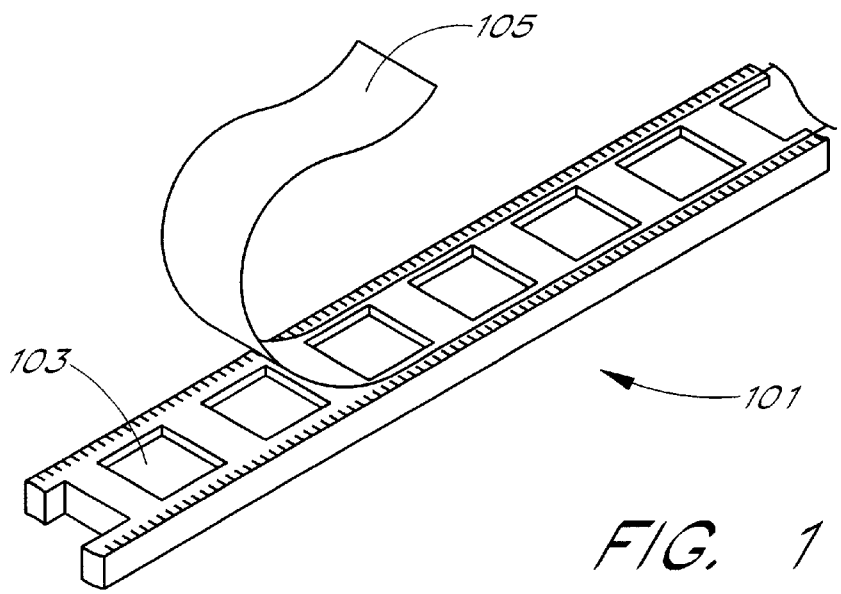
FIG. 1 is a perspective view showing a typical parts tape in which IC components may be stored and shipped prior to their assembly onto a PCB.
Figure 2:
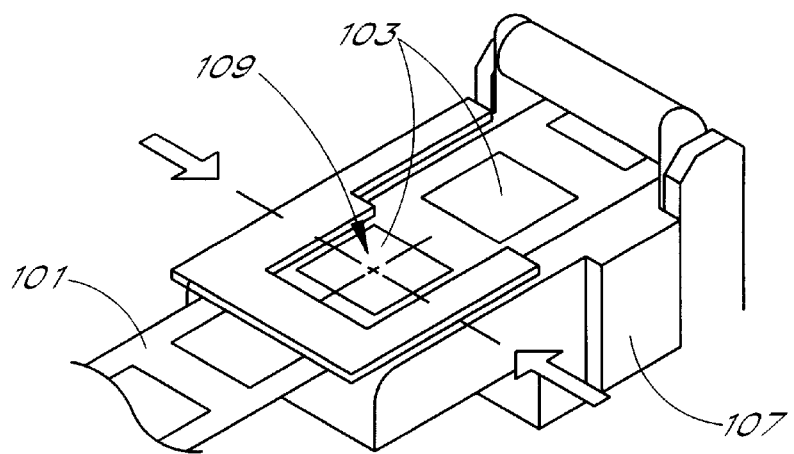
FIG. 2 is a perspective view illustrating a perspective view of the parts tape of FIG. 1 being fed through a feeder.

In one embodiment, the parts tape 101 may be fed through a feeder 107 (FIG. 2), as the parts tape 101 emerges from the thermal oven 111 through the outfeed slot 113. Thus, that each component within the parts tape 101 reaches a pick-up point 109 (FIG. 2) where the component is extracted from the tape 101 by the vacuum nozzle 115. The vacuum nozzle 115 retrieves components (not shown) within the cavities 103 of the parts tape 101 and thereafter places the components onto designated locations on printed circuit boards, as explained above. A slot cover 117, preferably of a flexible and thermally resistant rubber material, covers the slot 113 so as to minimize the escape of heat from the internal chamber of the thermal oven 111.

In another embodiment, the one or more parts tapes and reels are placed inside the thermal oven 111 and baked at a temperature range of 50–99° C. for approximately 2–4 hours. Although higher temperatures may be utilized, it is often times undesirable to exceed 100° C., which is the boiling point for water. Maintaining the internal temperature of the thermal oven 111 below 100° C. insures that the moisture trapped in the packaging of the components never reaches a boiling point so as to pose a risk of the "popcorn effect" inside the thermal oven 111. However, higher temperatures may be utilized if it is determined that the risk of producing the "popcorn effect" during the baking process is outweighed by other factors, e.g., the advantage of faster bake times at these higher temperatures.

It will be further recognized that a series of reels may be used in parallel within the thermal chamber such that thermally conditioned components are sequentially emerging from the thermal oven 111, thereby effectively eliminating manufacturing "dead" time and increasing throughput. For example, in one embodiment, a single, variable position placement machine with vacuum nozzle 115 is utilized which has the capability of picking conditioned components from adjacent reels as the components emerge from the oven 111. The emergence of the components on adjacent reels is staggered sufficiently such that the placement machine is operating at or near its capacity. It will be recognized, however, that numerous other configurations of multiple reels cooperating with placement machines may be used consistent with the invention.

Outfeeding the parts tape 101 at a rate which is proportional to the rate of component retrieval by the vacuum nozzle 115 insures that the components are exposed to moisture in the atmosphere for a minimum amount of time prior to being picked up by the nozzle 115 and placed onto their designated circuit boards for subsequent reflow soldering. In one embodiment, the slot 113 and corresponding slot cover 117 extend substantially along the width of the thermal oven 111 such that any one of multiple parts tapes 101 contained in series within the chamber of the thermal oven 111 may be fed out from the thermal oven 111 through the slot 113 without having to substantially redirect or bend the parts tape 101 as it is being unrolled from its corresponding reel.

Figure 4:
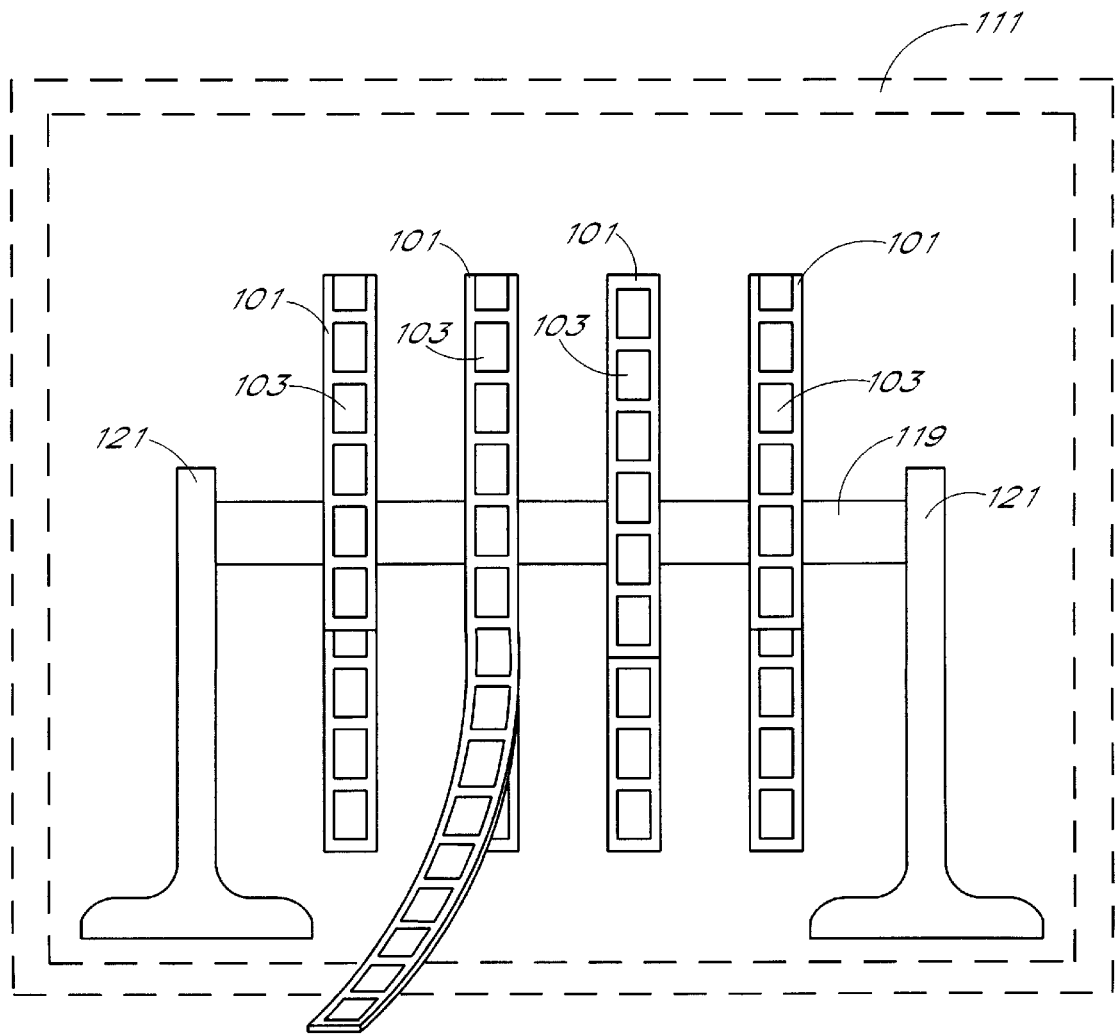
FIG. 4 is a cross-sectional view, taken along lines 4—4 of FIG. 3, showing the thermal oven of that figure having four parts tape reels contained in series therein.

FIG. 4 illustrates a cross-sectional view, taken along lines 4—4 of FIG. 3, which shows the internal chamber of the thermal oven 111 having four parts tape reels 101 contained in series therein. Although only four parts tape reels 101 are illustrated, it is understood that the oven 111 may be configured so that any number of parts tapes reels 101 may be simultaneously loaded into the thermal oven, based upon the size of the thermal oven 111. As described above, the parts tapes 101 each include a plurality of cavities 103 for containing components therein (not shown) to be assembled. The parts tapes and reels 101 are supported by and spin around a spindle 119 having support members 121 at each end to secure and support the spindle 119. In one embodiment, the spindle 119 is automatically rotated at a desired rate by a motor driven threaded rod assembly (not shown). However, any system or apparatus capable of automatically, or manually, rotating the spindle 119 at a desired rate, which is known in the art or which may become known in the art, may be utilized to rotate the spindle 119 in accordance with the invention.

Figure 5:
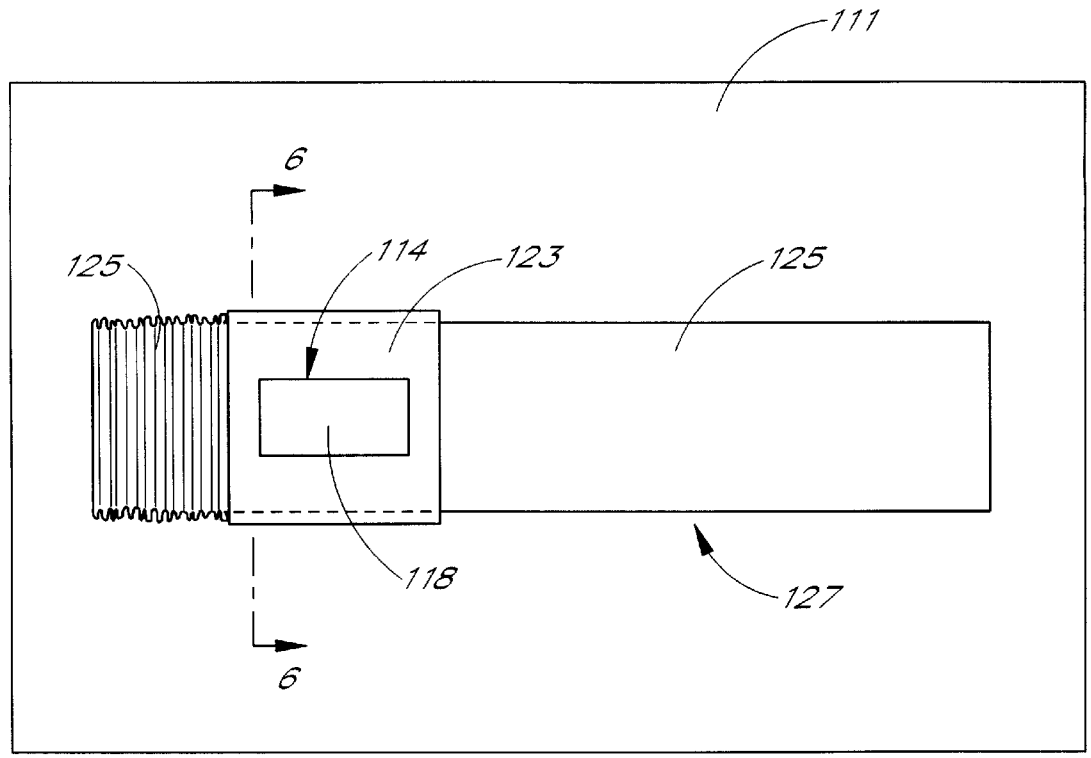
FIG. 5 is a top plan view of one embodiment of a thermal oven of the invention, wherein the thermal oven includes a slidable slot located at one side of the thermal oven.

FIG. 5 illustrates one embodiment of the thermal oven 111 having a slidable slot 114 located at one side of the thermal oven 111. Because the slot 114 is slidable, it is not necessary that it extend across a substantial portion of the width of the thermal oven 111 to accommodate the plurality of parts tape reels 101 located in the thermal oven 111. By sliding the slot 114 to its left-most position, the parts tape 101 located at the left-most position within the oven 111 may be fed out of the thermal oven 111 through the slot 114 thus, the parts tape 101 may be unrolled freely and linearly from that location, without twisting, bending or skewing the direction of outfeed from the internal chamber 111.

As shown in FIG. 5, the slot 114 is an aperture on a slidable plate 123 having a flexible sealing curtain 125 attached at each lateral end of the slidable plate 123. The flexible sealing curtain 125 is preferably made of a heat resistant, flexible material which folds and wrinkles to gather at one end as the slot plate 123 is slid from the left to the right to accommodate the outfeed of different ones of parts tapes 101 within the thermal oven 111. The purpose of the sealing curtain 125 is to provide a means for sealing a larger underlying slot 127 so as to minimize the escape of heat from the internal chamber of the thermal oven 111. As the slide plate 123 is slid either to the left or to the right, the sealing curtains 125 bend and wrinkle as necessary to accommodate the motion of the sliding plate 123 while still maintaining a seal over the underlying aperture 127.

The sealing curtains 125 may be slidably attached to flanges (FIG. 6) extending outwardly from top and bottom peripheral edges of the underlying larger slot 127 in a fashion similar to the way the slide plate 123 is slidably attached to the flanges 129, as described in further detail below with respect to FIG. 6. Each of the sealing curtains 125 may be rigidly attached at the corresponding left and right peripheral edges of the underlying larger slot 127. Numerous other options will be readily apparent to those skilled in the art for providing a sealing curtain 125 which slidably adjusts as the slide plate 123 is slid along the underlying slot 127, in accordance with the invention. Furthermore, any of numerous other methods and systems, readily apparent to those skilled in the art, may be used to provide a slidable slot 114 which allows a parts tape 101 to pass therethrough while minimizing the escape of heat, in accordance with teachings of the invention.

In one embodiment, the slidable slot 114 is further covered by a flexible slot cover 118 so as to further reduce the escape of heat from the internal chamber of the thermal oven 111. This flexible slot cover 118 may be of any flexible material capable of withstanding exposure to temperatures of up to 100° C., or more, such as thermally resistant rubber.

Figure 6:
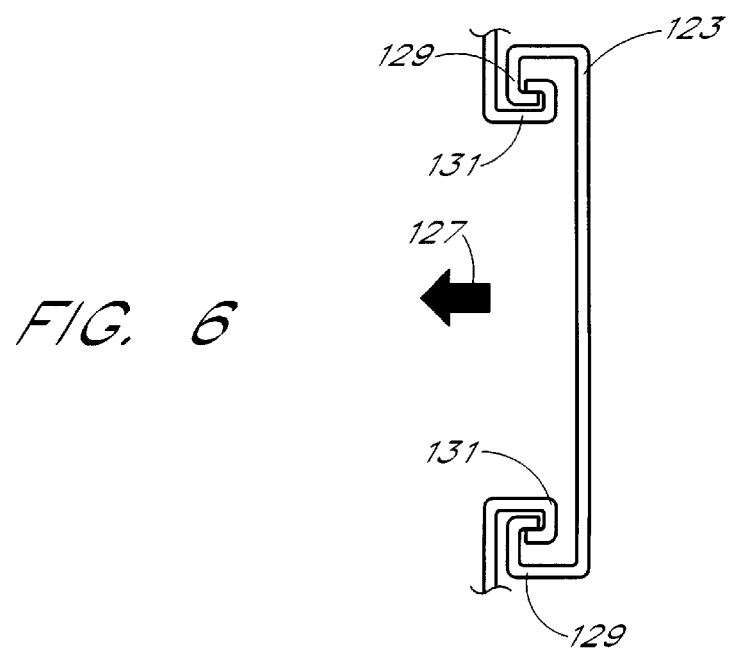
FIG. 6 is a cross-sectional view, taken along lines 6—6 of FIG. 5, of the slot plate of that thermal oven.

FIG. 6 is a cross-sectional view, taken along lines 6—6 of FIG. 5, showing the slot plate 123 having inwardly curving lip portions 129 which slidably engage flanged guide rails 131 extending outwardly from the side surface of the thermal chamber 111 (FIG. 5). As shown in FIG. 6, the flanged guide rails 131 extend outwardly from the top and bottom peripheral edges of the underlying larger aperture 127. As discussed above, although a specific embodiment of the slidable slot 114 has been described, it is understood that many different structures, configurations and/or assemblies can be implemented by those of ordinary skill in art so as to effectuate the functionality of a slidable slot 114 as described above. Thus, the invention is not limited to the particular embodiment of the slidable slot 114 described herein.

Figure 7:
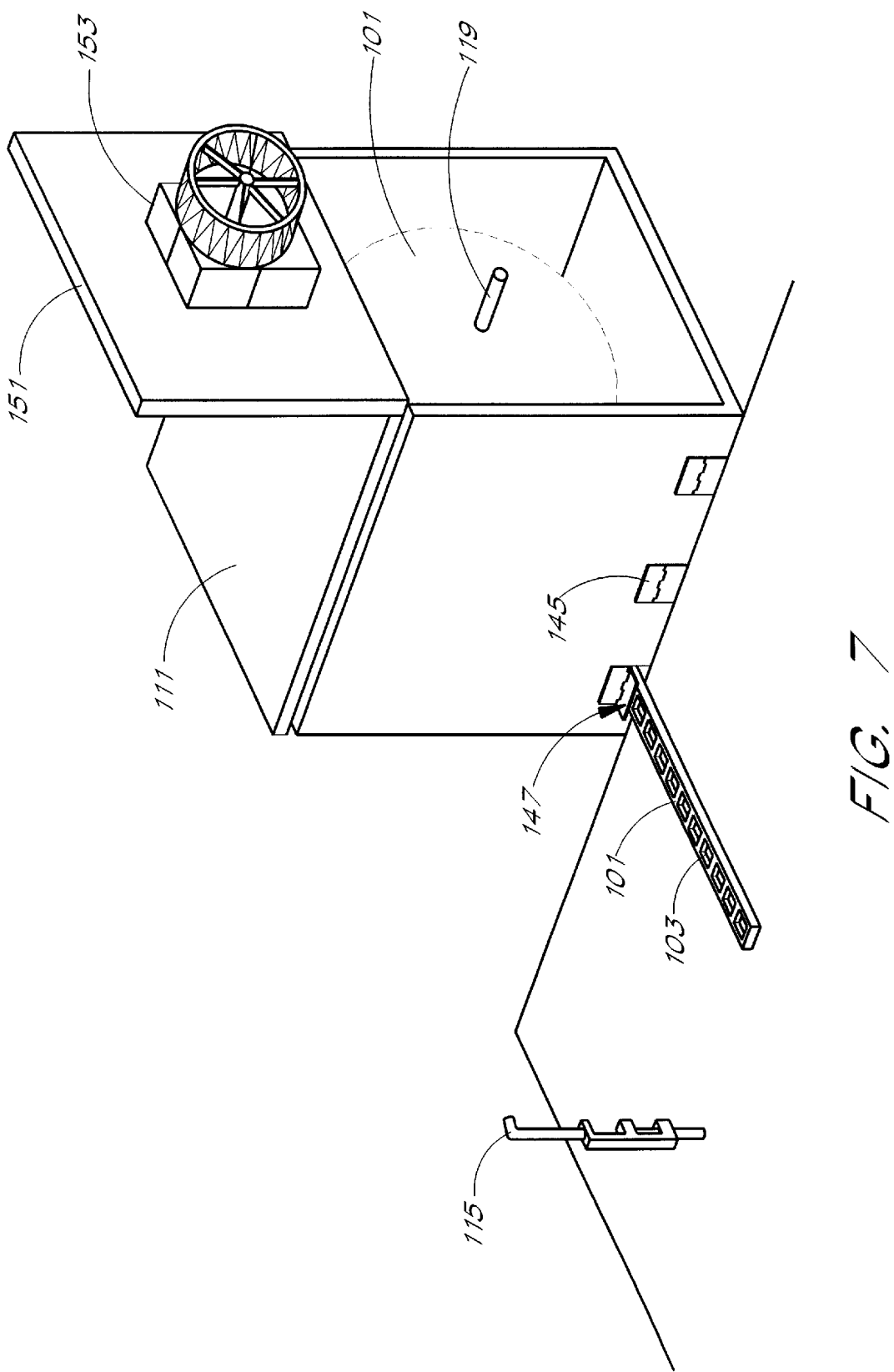
FIG. 7 is a perspective view of a system for in-line baking of components in a parts tape and reel immediately prior to automated assembly of the components onto designated PCBs, in accordance with another embodiment of the invention.

FIG. 7 illustrates another embodiment of an in-line baking system in accordance with the invention. The system includes a thermal oven 111 which contains therein a plurality of parts tapes and reels 101. The parts tapes and reels 101 are rotatably mounted on a spindle 119 which passes through a central axis of the reels 101. The thermal oven 111 further includes a plurality of outfeed slots 145 located adjacent to one another along a side wall of the thermal oven 111. Each outfeed slot 145 is configured and positioned to pass therethrough at least one parts tape 101 located within the internal chamber of the thermal oven 111. In one embodiment, each outfeed slot 145 includes a hinged cover plate 147 which swings open as a parts tape 101 passes through the outfeed slot 145. The cover plate 147 inhibits the escape of heat from the internal chamber of the thermal oven 111 when there is no parts tape 101 passing through a corresponding outfeed slot 145. It is further contemplated that each cover plate 147 may be replaced by flexible cover flaps, for example, made of a thermally resistant rubber or plastic, which allows a parts tape 101 to pass through a corresponding outfeed slot 147 while minimizing the escape of heat therethrough. As portions of the parts tape 101 emerge through an outfeed slot 145, a pick and place head 115 of an automated placement machine (not shown) retrieves components (not shown) contained within cavities 103 of the parts tape 101.

The thermal chamber 111 includes a side door 151 which may be opened to insert one or more parts tapes and reels 101 into the internal chamber of the thermal oven 111. Attached to an inside surface of the side door 151 is a heater 153 having a heater fan 155 attached thereto. The heater 153 heats the air within the thermal oven 111 to a desired temperature as the fan 155 circulates the air within the internal chamber of the thermal oven 111. Numerous conventional heater and heater fan assemblies are well-known in the art which may be utilized in accordance with the invention. Temperature gauges (not shown) may be provided to monitor and regulate the internal temperature of the thermal oven 111. Such temperature gauges, and other devices for monitoring and regulating the internal temperature of the thermal oven are well-known and need not be further described here.

In one embodiment, the heater 153 and heater fan 155 may be replaced by an air deionizer (not shown) which blows and circulates deionized air in the internal chamber of the thermal oven 111. In another embodiment, such a deionizer is used in conjunction with the heater 153 and heater fan 155. It is contemplated that the blowing of deionized air within the thermal oven will facilitate the removal of water vapor from component packages contained within the thermal oven 111. Any one of numerous well-known and commercially available air deionizers may be used in accordance with the invention.

In yet another embodiment, any one of the foregoing embodiments of the in-line baking system may be equipped with a vacuum device for maintaining a relative vacuum (e.g., pressure less than the prevailing atmospheric pressure) within the thermal oven 111 such that the water vapor pressure within the oven is reduced. This reduction in water vapor pressure accordingly results in vaporization of any moisture present within the components being conditioned at a lower temperature, thereby reducing thermal stress on the components, or alternatively allowing for faster bake times at the same temperature. In the present embodiment, one or more vacuum fixtures are connected to the oven 111; non-collapsible tubing connects the fixtures to a conventional high-volume vacuum source. A vacuum gauge is also mounted to the oven 111 to sense and regulate the local vacuum created therein. It will be appreciated, however, that a large variety of systems for maintaining vacuum within the oven 111 may be used with equal success, the construction and operation of these systems being well known to those skilled in the mechanical arts. Furthermore, it will be recognized that while the use of a vacuum is described herein, it may be desirable under certain circumstances such as purging to maintain a positive relative pressure (e.g., one higher than atmospheric pressure) within the oven using, for example, an inert gas such as nitrogen. Such use of positive pressure is also contemplated by the invention.

The invention may be embodied in other specific forms without departing from its spirit or essential characteristics. The described embodiments are to be considered in all respect only as illustrative and not restrictive. The scope of the invention is, therefore, indicated by the appended claims, rather than by the foregoing description. All changes which come within the meaning and range of equivalency of the claims are to be embraced within their scope.

What is claimed is:

1. A system for removing trapped moisture from component packages prior to assembly of the components onto a circuit board, comprising:
    a thermal chamber which receives therein at least one parts tape and reel containing a plurality of components and which heats said plurality of components at a predetermined temperature for a predetermined period of time; and
    an outfeed slot located on a wall of the thermal chamber and configured such that a leading portion of the at least one parts tape passes therethrough.

2. The system of claim 1 further comprising a pick and place machine, located adjacent to said thermal chamber, which retrieves components from portions of the parts tape which have passed through the outfeed slot and places the retrieved components onto designated circuit boards.

3. The system of claim 2 wherein said at least one parts tape passes through said outfeed slot at a rate that is proportional to a rate at which said pick and place machine retrieves said components from the parts tape.

4. The system of claim 1 further comprising a flexible slot cover, coupled to the outfeed slot, for substantially covering the outfeed slot so as to inhibit outflow of heat from the thermal chamber while allowing the parts tape to pass through the outfeed slot.

5. The system of claim 1 wherein said thermal chamber contains a plurality of parts tapes and reels and wherein said outfeed slot is slidable along said wall of the thermal chamber so as to be positioned to pass a selected parts tape from the thermal chamber through the outfeed slot.

6. The system of claim 1 wherein said predetermined temperature is less than or equal to 100 degrees Celsius.

7. The system of claim 1 wherein said at least one parts tape is made from a polymer.

8. The system of claim 7 wherein said polymer is a conductive polystyrene.

9. The system of claim 1 further comprising an air deionizer, coupled to said thermal chamber, which blows deionized air into the thermal chamber.

10. The system of claim 1 further comprising an apparatus for maintaining a pressure other than atmospheric pressure within at least a portion of said thermal chamber.

11. The system of claim 10, wherein said pressure other than atmospheric pressure comprises a vacuum.

12. A system for assembling components onto a circuit board, comprising:
    a thermal chamber which receives a plurality of components therein and which heats the plurality of components at a predetermined temperature for a predetermined period of time; and
    at least one outfeed slot located on a wall of the thermal chamber and configured such that at least one component from the plurality of components passes therethrough and emerges externally of the thermal chamber.

13. The system of claim 12 further comprising a pick and place machine, located adjacent to the thermal chamber, which retrieves the at least one component and places the at least one component onto a designated circuit board.

14. The system of claim 13 wherein said plurality of components are successively passed through said at least one outfeed slot at a rate that is proportional to a rate at which said pick and place machine retrieves the at least one component.

15. The system of claim 12 further comprising at least one slot cover, coupled to said at least one outfeed slot, so as to substantially cover the at least one outfeed slot and to inhibit outflow of heat from the thermal chamber while allowing said at least one component to pass through the at least one outfeed slot.

16. The system of claim 12 further comprising an air deionizer, coupled to said thermal chamber, which blows deionized air into the thermal chamber.

17. The system of claim 12 further comprising an apparatus for maintaining a pressure other than atmospheric pressure within at least a portion of said thermal chamber.

18. The system of claim 17, wherein said pressure other than atmospheric pressure comprises a vacuum.

19. A system for removing trapped moisture from component packages and thereafter assembling the components onto a circuit board, comprising:
    a thermal chamber which receives therein at least one parts tape and reel containing a plurality of components and which heats said plurality of components at a predetermined temperature for a predetermined period of time;
    an outfeed slot located on a wall of the thermal chamber and configured such that a leading portion of the at least one parts tape passes therethrough;
    a slot cover, coupled to the outfeed slot, for substantially covering the outfeed slot so as to inhibit outflow of heat from the thermal chamber while allowing the parts tape to pass through the outfeed slot; and a pick and place machine, located adjacent to said thermal chamber, which retrieves components from portions of the parts tape that have passed through the outfeed slot and places the retrieved components onto designated circuit boards.

20. The system of claim 19 wherein said at least one parts tape passes through said outfeed slot at a rate that is proportional to a rate at which said pick and place machine retrieves said components from the parts tape.

21. The system of claim 19 wherein said thermal chamber contains a plurality of parts tapes and reels and wherein said outfeed slot is slidable along said wall of the thermal chamber so as to be positioned to pass a selected parts tape from the thermal chamber through the outfeed slot.

22. The system of claim 19 further comprising an air deionizer, coupled to said thermal chamber, which blows deionized air into the thermal chamber.

23. The system of claim 19 further comprising an apparatus for maintaining a pressure other than atmospheric pressure within at least a portion of said thermal chamber.

24. The system of claim 23, wherein said pressure other than atmospheric pressure comprises a vacuum.

25. A system for assembling components onto a circuit board, comprising:

means for heating at least one parts tape and reel and at least one component contained within the at least one parts tape at a predetermined temperature for a predetermined period of time in a thermal chamber;

means for passing a portion of the at least one parts tape from within the thermal chamber, at the expiration of the predetermined length of time; and means for retrieving the at least one component from the portion of the parts tape which has passed out of the thermal chamber and placing the at least one component onto a designated circuit board.

26. The system of claim 25 wherein said means for passing portion of said at least one parts tape comprises an outfeed slot located on said thermal chamber.

27. The system of claim 25 wherein said means for retrieving retrieves said at least one component at a rate which is proportional to a rate at which the at least one component is passed through said outfeed slot.

28. The system of claim 25 wherein said means for heating heats said parts tape and said at least one component at a temperature less than or equal to 100 degrees Celsius.

29. The system of claim 25 further comprising means for maintaining a pressure other than atmospheric pressure within at least a portion of said thermal chamber.

30. A system for assembling components onto a circuit board, comprising:

means for heating at least one component at a predetermined temperature within a thermal oven for a predetermined period of time;

means for passing the at least one component out of the thermal oven at the expiration of the predetermined length of time, such that the at least one component emerges externally of the thermal oven;

means for retrieving the at least one component which emerges from the thermal oven; and means for placing the at least one component onto a designated circuit board.

31. The system of claim 30 wherein said at least one component comprises a plurality of components and said means for retrieving retrieves said plurality of components at a rate which is proportional to a rate at which the plurality of components are passed out of said thermal oven.

32. The system of claim 30 wherein said means for heating heats said at least one component at a temperature less than or equal to 100 degrees Celsius.

33. The system of claim 30 further comprising blowing deionized air within an internal chamber of said thermal oven.

34. A method of assembling components onto a circuit board, comprising:

placing at least one parts tape and reel, having at least one component therein, in an interior chamber of a thermal oven;

heating the at least one parts tape and reel and the at least one component at a predetermined temperature within the thermal oven for a predetermined period of time;

passing a portion of the at least one parts tape from the thermal oven, at the expiration of the predetermined length of time, through an outfeed slot on the thermal oven; and retrieving the at least one component from the portion of the parts tape which has passed through the outfeed slot and placing the at least one component onto a designated circuit board.

35. The method of claim 34 wherein said portion of said at least one parts tape is passed through said outfeed slot at a rate which is proportional to a rate at which the at least one component is retrieved from the parts tape.

36. The method of claim 34 wherein said act of heating is performed at a temperature less than or equal to 100 degrees Celsius.

37. The method of claim 34 further comprising sliding the outfeed slot to a desired location on said thermal oven so as to position the outfeed slot to pass portions of a selected parts tape out of said thermal oven.

38. The method of claim 34, further comprising the act of drawing a vacuum within at least a portion of said thermal oven.

39. A method of assembling components onto a circuit board, comprising:

placing at least one component into an interior chamber of a thermal oven;

heating the at least one component at a predetermined temperature within the thermal oven for a predetermined period of time;

passing the at least one component through an outfeed slot located on the thermal oven, at the expiration of the predetermined length of time, such that the at least one component emerges externally of the thermal oven;

retrieving the at least one component which emerges from the thermal oven through the outfeed slot; and placing the at least one component onto a designated circuit board.

40. The method of claim 39 wherein said at least one component comprises a plurality of components and said act of passing the at least one component comprises successively passing each one of said plurality of components through said outfeed slot at a rate which is proportional to a rate at which the plurality of components are retrieved.

41. The method of claim 39 wherein said act of heating is performed at a temperature less than or equal to 100 degrees Celsius.

42. The method of claim 39 further comprising sliding the outfeed slot to a desired location on said thermal oven so as to position the outfeed slot to pass portions of a selected parts tape out of said thermal oven.

43. A thermally conditioned component, conditioned using the method comprising:

placing at least one parts tape and reel in an interior chamber of a thermal oven, wherein the parts tape at least partially contains at least one component to be thermally conditioned;

heating the at least one parts tape, reel, and said at least one component at a predetermined temperature within the thermal oven for a predetermined period of time; and at the expiration of a predetermined length of time, passing a portion of the at least one parts tape containing said at least one component from the thermal oven through an outfeed slot on the thermal oven.

44. The thermally conditioned component of claim 43, wherein said at least one component is an integrated circuit.

* * * * *

UNITED STATES PATENT AND TRADEMARK OFFICE
CERTIFICATE OF CORRECTION

PATENT NO. : 6,054,682

DATED : April 25, 2000

INVENTOR(S): Ochoa et al.

It is certified that error appears in the above-identified patent and that said Letters Patent is hereby corrected as shown below:

At [73], please delete "Boise" and insert therefore --Nampa--.

Signed and Sealed this

Twenty-second Day of May, 2001

*Attest:*

NICHOLAS P. GODICI

*Attesting Officer*     Acting Director of the United States Patent and Trademark Office